(12) United States Patent
Drowley et al.

(10) Patent No.: US 7,749,874 B2
(45) Date of Patent: Jul. 6, 2010

(54) DEEP IMPLANT SELF-ALIGNED TO POLYSILICON GATE

(75) Inventors: Clifford I. Drowley, Scottsdale, AZ (US); David Cohen, Migdal Haemek, IL (US); Assaf Lahav, Migdal Haemek, IL (US); Shai Kfir, Migdal Haemek, IL (US); Naor Inbar, Migdal Haemek, IL (US); Anatoly Sergienko, Migdal Haemek, IL (US); Vladimir Korobov, San Mateo, CA (US)

(73) Assignee: Tower Semiconductor Ltd., Migdal Haemek (IL)

( * ) Notice: Subject to any disclaimer, the term of this patent is extended or adjusted under 35 U.S.C. 154(b) by 273 days.

(21) Appl. No.: 11/691,457

(22) Filed: Mar. 26, 2007

(65) Prior Publication Data

US 2008/0237653 A1  Oct. 2, 2008

(51) Int. Cl.
*H01L 21/425*  (2006.01)
*H01L 31/062*  (2006.01)
*H01L 31/113*  (2006.01)

(52) U.S. Cl. .................. 438/514; 438/527; 438/529; 438/531; 438/532; 257/292; 257/233; 257/E27.132; 257/E27.133

(58) Field of Classification Search .......... 257/E27.132, 257/E27.133, 288, 290–292, 183.1, 184, 257/233; 438/48, 60, 57, 59, 514, 527, 529, 438/531–532, 197, 199, 229–232

See application file for complete search history.

(56) References Cited

U.S. PATENT DOCUMENTS 6,100,556 A   8/2000  Drowley et al.
6,483,149 B1  11/2002 Mosher et al.

(Continued)

OTHER PUBLICATIONS

Bengtsson et al. "Small-Signal and Power Evaluation of Novel BiCMOS-Compatible Short-Channel LDMOS Technology," IEEE Transactions on Microwave Theory and Techniques, vol. 51, No. 3, Mar. 2003, pp. 1052-1056.
Itonaga et al. "A High-Performance and Low-Noise CMOS Image Sensor with an Expanding Photodiode under the Isolation Oxide," Electron Devices Meeting, 2005, IEDM Technical Digest, IEEE International, Dec. 5-7, 2005, 4 pgs.

*Primary Examiner*—A. Sefer
*Assistant Examiner*—Ermias Woldegeorgis
(74) *Attorney, Agent, or Firm*—Bever, Hoffman & Harms, LLP; Patrick T. Bever

(57) ABSTRACT

A CMOS image sensor includes a pinned photodiode and a transfer gate that are formed using a thick mask that is self-aligned to at least one edge of the polysilicon gate structure to facilitate both the formation of a deep implant and to provide proper alignment between the photodiode implant and the gate. In one embodiment a drain side implant is formed concurrently with the deep n-type implant of the photodiode. After the deep implant, the mask is removed and a shallow p+ implant is formed to complete the photodiode. In another embodiment, the polysilicon is etched to define only a drain side edge, a shallow drain side implant is performed, and then a thick mask is provided and used to complete the gate structure, and is retained during the subsequent high energy implant. Alternatively, the high energy implant is performed prior to the shallow drain side implant.

3 Claims, 12 Drawing Sheets

U.S. PATENT DOCUMENTS

| | | |
|---|---|---|
| 6,800,528 B2 | 10/2004 | Sasaki |
| 6,818,494 B1 | 11/2004 | Chen et al. |
| 2005/0112822 A1 | 5/2005 | Litwin |
| 2005/0148114 A1 * | 7/2005 | Rhodes ........................ 438/120 |
| 2006/0006489 A1 * | 1/2006 | Park ........................... 257/462 |

* cited by examiner

DEEP IMPLANT SELF-ALIGNED TO POLYSILICON GATE

FIELD OF THE INVENTION

This invention relates to integrated circuits (ICs) formed on semiconductor substrates (e.g., silicon), and more particularly to ICs that include deep (high energy) implant regions formed in the semiconductor substrate.

BACKGROUND OF THE INVENTION

FIG. 1 is simplified schematic diagram showing a four transistor (4T) CMOS image sensor pixel including a fully pinned photodiode PPD and a transfer gate MX, which represents one embodiment of an IC including a deep implant.

Fully pinned diode PPD is a diode with finite and relatively small free charge capacity. In most cases the diode is constructed in p-type epi using deep n-type implant and additional shallow p+ implant above the deep n implant, the free charge of the pinned PD are electrons which accumulating in the potential well which is imposed by the implants. Evacuating electrons from this potential well through the transfer gate MX increases the voltage which is built on the diode. When all electrons are evacuated, the voltage reaches its highest value—VPINN. The integration of light can be started at this point, i.e., with no electrons inside the diode. The diode starts to integrate when all electrons are evacuated from the PPD (start-of-integration event). The diode voltage in this stage is defined accurately to the same value for each event. This enables noise reduction and it is the main advantage of the fully pinned PD over conventional diodes.

In order to insure low noise operation, all electrons must be evacuated from the diode through the link region between the diode and the transfer gate MX. The link between pinned photodiode and transfer gate MX is very sensitive to variations in the fabrication process tolerances associated with the semiconductor fabrication facility used to make the CMOS image sensor "chips" that includes CMOS image sensor pixels, such as the 4T CMOS image sensor pixel with a fully pinned photodiodes of FIG. 1. Thus, it is important that the fabrication process utilized to produce image sensors including fully pinned photodiodes reliably link the fully pinned photodiodes to their associated transfer gate.

Prior Art 1

One approach for addressing the photodiode/transfer gate linking problem is implemented by forming the diode diffusion region adjacent to the transfer gate using a self-aligned shallow implantation process. This solution is used when the alignment tolerances of a particular fabrication facility are relatively inaccurate, and is depicted in FIGS. 2(A) to 2(D).

Referring to FIG. 2(A), a thermal oxide layer 51 is created on a p-type silicon wafer 50, followed by a polycrystalline silicon (polysilicon) layer 52, and finally a $1^{st}$ photoresist layer 53. As indicated in FIG. 2(B), the photoresist is exposed and developed to create a transfer gate mask 54. In FIG. 2(C) the polysilicon layer is then etched using the transfer gate mask to form a polysilicon transfer gate 55, and the transfer gate mask is then removed. As shown in FIG. 2(C), a $2^{nd}$ photoresist layer 56 is patterned to expose the silicon wafer on one side of transfer gate 55, and to protect the rest of silicon wafer 50. Finally, as shown in FIG. 2(D), a diode implant process is performed in which ions are bombarded at an angle (as indicated by arrows). As a result, if the energy of the bombardment ions is low enough, bombardment ions do not penetrate the Silicon wafer area below the transfer gate 55 except at the left edge, which is not protected by photoresist. In this way the conducting implant region 50A has a fixed overlap with the MOS gate edge. Subsequently, a third mask (not shown) is formed over the implant region, and a transfer gate drain region is formed on the right side of the transfer gate poly using known CMOS fabrication techniques.

A problem associated with the above approach is that the resulting implant region 50A is relatively shallow (100 to 300 nm, depends on the thickness of the TG poly, and the microstructure of the polysilicon), and is thus insufficient to provide a suitable photodiode in some applications.

Prior Art 2

A second approach for addressing the photodiode/transfer gate linking problem involves forming a shallow implant that is self aligned to the polysilicon gate and its photoresist. This solution is depicted in FIGS. 3(A) to 3(D).

Similar to the process described above with FIGS. 2(A) and 2(B), FIG. 3(A) shows a thin thermal oxide layer 51 created on a p-type silicon wafer 50, followed by a polysilicon layer 52, and a $1^{st}$ photoresist layer 53 having a standard mask thickness, and FIG. 3(B) shows a patterned portion of the first photoresist forming a transfer gate mask 54 on polysilicon layer 52. In FIG. 3(C) the polysilicon layer is then etched as above using transfer gate mask 54 to form a polysilicon transfer gate 55, but in this case transfer gate mask 54 is retained. Then a $2^{nd}$ photoresist layer 60 is patterned over transfer gate mask 54 such that silicon wafer 50 is exposed on one side of the transfer gate 55, and the rest of the silicon wafer is masked. Finally, as shown in FIG. 3(D), a diode implant process is performed. In this way, the stop layer for ion implantation on the polysilicon gate (i.e., provided by the retained transfer gate mask 54) is thicker than in the approach described above, thus allowing a higher energy implant process that produces an implant region 50B having a depth of up to 600 nm, depending on the thickness of the polysilicon making up transfer gate 55, the microstructure of the polysilicon, and on the thickness of retained transfer gate mask 54 (after the etch process). However in advanced semiconductor fabrication, such as 0.25 um technology and below, due to the polysilicon thickness and the retained photoresist, the resulting implant region 50B is still too shallow to provide a suitable photodiode in some applications.

Prior Art 3

A third approach to addressing the photodiode/transfer gate linking problem is to form the diode diffusion region prior to forming the polysilicon transfer gate. This solution is used where the alignment tolerances of a particular fabrication facility are relatively accurate, and is depicted in FIGS. 4(A) to 4(C).

FIG. 4(A) shows a thermal oxide layer 51 created on a p-type silicon wafer 50, followed by a thick photoresist layer 62, which is patterned as shown in FIG. 4(B) to form a thick mask 64. As indicated in FIG. 4(C), due to the relatively thick photoresist layer forming mask 64, a relatively heavy implant can be performed to form a deep implant region SOC having a depth of 800 to 2500 nm. As shown in FIG. 4(D), the mask is then removed, and a polysilicon transfer gate 55 is then formed using the process described above.

The non-self-aligned approach described above provides a good solution to implanting high energy implant into the substrate. However, the method presents a new problem in that, unlike in the ideal case shown in FIG. 4(D), the polysilicon edge and the implant edge are touching, process tolerance variations of a given fabrication facility typically result in separation of these structures. FIG. 5(A) shows a first practical case where a spacing S is defined by between the implant and the polysilicon gate, and FIG. 5(B) shows a second practical case where the polysilicon gate overlaps the edge of the implant (indicated by dashed line circle), which is also undesirable.

Thus, none of the approaches described above produce a suitable CMOS image sensor with pinned photodiode. The first and second "self-aligned" prior art approaches provide a high level of certainty of proper alignment between the implant and gate, but cannot be used to produce an implant having a sufficient depth. Conversely, the third approach provides an implant having a suitable depth, but does not provide certainty of proper alignment between the implant and gate.

Thus, what is needed is a method for fabricating ICs with deep implant regions that are reliably aligned with a corresponding polysilicon gate structure. For example, what is needed is a method for fabricating a CMOS image sensor with pinned photodiode that both facilitates an implant region having a suitable depth, and provides certainty of proper alignment between the implant and gate.

SUMMARY OF THE INVENTION

The present invention is directed to methods for fabricating ICs with deep implant regions aligned to edges of polysilicon (e.g., gate) structures that overcomes the problems of conventional methods by utilizing a thick mask to pattern the polysilicon structures, and then retaining the thick mask on the polysilicon structure during the subsequent high energy implant process. In particular, as set forth in the exemplary embodiments described herein, after forming a polysilicon layer over a semiconductor substrate, mask material is deposited and patterned on the polysilicon layer, and the polysilicon layer is then etched through an opening in the mask such that the resulting patterned polysilicon structure is self-aligned to the mask (i.e., the mask edge limits the poly etching process such that the edge of the polysilicon structure is aligned with the edge of the mask). The high energy deep implant process is then performed using both the polysilicon structure and the mask, whereby the combined mask/poly structure prevents dopant from passing through the polysilicon structure and into undesirable regions of the substrate located under the polysilicon structure. In this manner, the present invention facilitates the fabrication of deep implant region regions that have diffusion depths greater than a thickness of the polysilicon structure, and are also precisely registered ("self-aligned") to the polysilicon structure.

In accordance with an exemplary embodiment of the present invention, a method is provided for fabricating CMOS image sensors having fully pinned photodiodes in which the link between the photodiode and the associated transfer gate is formed using a self-aligned process in order to prevent the effects of fabrication process tolerance variations, and in which high energy implant procedures are used to provide suitably deep implant regions. The novel methods achieve these objectives by providing a thick mask that is self aligned to at least one edge of the polysilicon gate structure, thereby facilitating both the formation of a deep implant and providing a high level of certainty of proper alignment between the photodiode implant and the gate.

In accordance with a first embodiment of the present invention, a method for producing CMOS image sensors utilizes a single-step polysilicon photolithography and etch process in which a relatively thick gate mask is stamped, printed or otherwise patterned on a polysilicon layer, and then the polysilicon layer is etched to form a completely formed transfer gate structure. After etching the polysilicon layer, the thick gate mask, which is self-aligned to the side edges of the underlying gate structure, is retained during a subsequent deep (high energy) implant process during which n-type dopant is diffused into corresponding deep implant regions located on both sides of the transfer gate structure. Shallow implants are then formed over the deep implants using conventional, relatively thin masks to complete the fully pinned photodiode. By retaining the self-aligned thick mask on the transfer gate structure during the deep implant process, the present invention provides both self-alignment of the photodiode to the gate structure and a suitable (i.e., relatively deep) implant depth.

In other embodiments, a two-step polysilicon photolithography and etch process is employed in which only a portion of the polysilicon layer is etched during a first step such that the partially formed polysilicon gate structure includes only a drain side edge. In one embodiment, a relatively shallow drain side implant is formed using the partially formed polysilicon gate structure as a mask, and then a thick mask is formed (standard litho-deposit photoresist-develop) over the drain side implant and a portion of the polysilicon gate structure, and this mask is used during a second poly etch process to complete the polysilicon gate structure by defining the second (i.e., photodiode) side edge of the polysilicon gate. Because the thick mask, which is self-aligned to the second side edge of the gate, is retained during a subsequent high energy implant, both self-alignment of the photodiode to the gate structure and a suitable implant depth are produced. In another embodiment, the thick mask, second poly etch, and deep implant are performed before the shallow drain side implant.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in the fabrication techniques for ICs having deep implant regions that are registered to associated polysilicon structure, and is described with particular reference to the fabrication of CMOS image sensors that include fully pinned photodiodes. The following description is presented to enable one of ordinary skill in the art to make and use the invention as provided in the context of a particular application and its requirements. As used herein, directional terms such as "upper" and "lower" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

1$^{st}$ Embodiment

FIGS. 6(A) to 6(F) are cross-sectional side views showing a portion of a CMOS image sensor having a pinned photodiode and an associated transfer gate according with a first exemplary embodiment of the present invention.

Figure 6A:
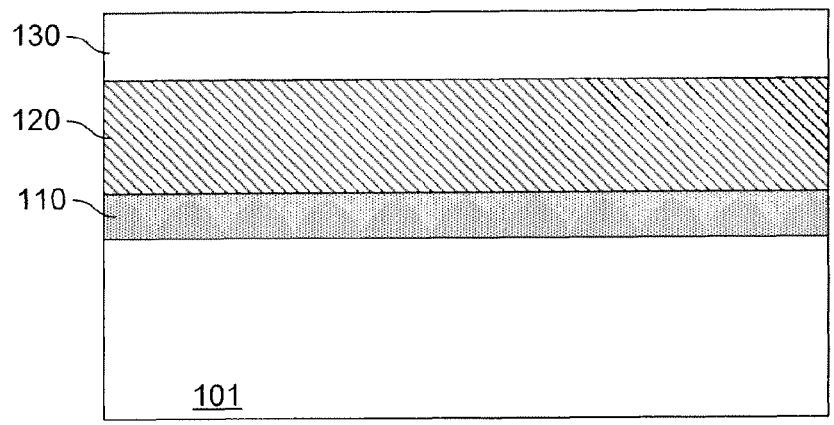
FIGS. 6(A), 6(B), 6(C), 6(D), 6(E) and 6(F) are cross-sectional side views depicting a process for fabricating CMOS image sensor pixels having PPDs and associated transfer gates according to an embodiment of the present invention.
Figure 6B:
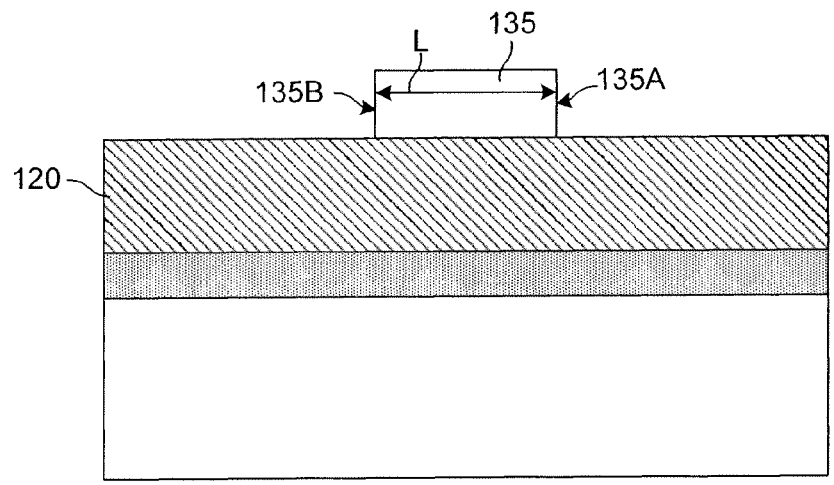

Referring to FIG. 6(A), the structure is formed on a p-type monocrystalline silicon substrate 101. A thin (e.g., <10 nm) dielectric (e.g., thermal oxide) layer 110 is formed on an upper surface of substrate 101 using known techniques. A polysilicon layer 120 having a thickness of 100 nm to 300 nm is then formed on dielectric layer 110 using known techniques. Next, a relatively thick (e.g., 300 nm to 2500 nm) mask material (e.g., photoresist) layer 130 is formed over polysilicon layer 120. In one embodiment, mask material layer 130 is deposited using known techniques and then patterned (exposed and developed) using known techniques to form a gate mask 135 (shown in FIG. 6(B)). In accordance with an alternative embodiment, gate mask 135 is stamped, printed, or otherwise patterned in a single step on polysilicon layer 120. In either case, gate mask 135 includes opposing side edges 135A and 135B separated by a predetermined length L that corresponds with a desired length of the transfer gate. As explained below, thick mask material 130 facilitates a much higher energy implant process than is possible using a conventionally formed (relatively thin) photoresist layer. Stamping or printing the mask material on polysilicon layer 120 provides a thicker transfer gate mask that is suitable for high energy implant processes in a more efficient manner than is possible using more conventional lithographic mask forming techniques.

Figure 6C:
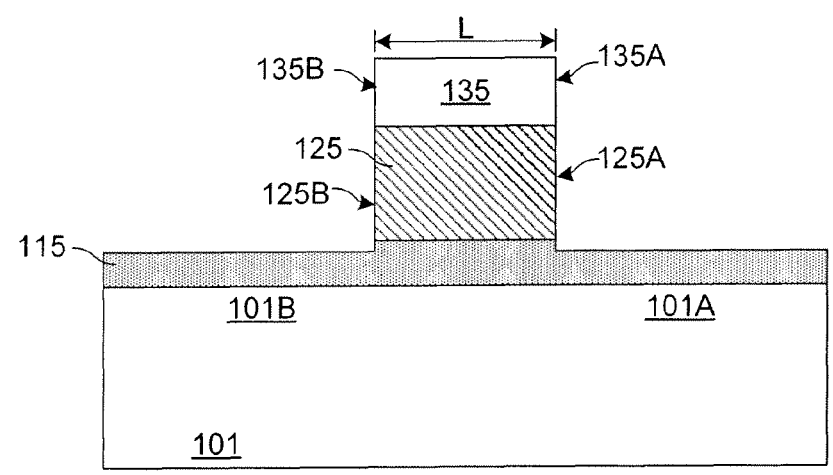

Referring to FIG. 6(C), the polysilicon layer is then etched according to known techniques such that a polysilicon transfer gate structure 125 is formed using a single-step photolithography and etch process. That is, gate structure 125 is subjected to a single etching process that produces opposing first and second side edges 125A and 125B separated by the desired gate width W, and exposes first and second regions 101A and 101B of substrate 101. Note that the etching process causes a self-alignment between opposing first and second side edges 135A and 135B and first and second side edges 125A and 125B, respectively, such that side edge 135A of gate mask 135 is coplanar with side edge 125A of gate structure 125, and side edge 135B of gate mask 135 is coplanar with side edge 125B of gate structure 125.

Figure 6D:
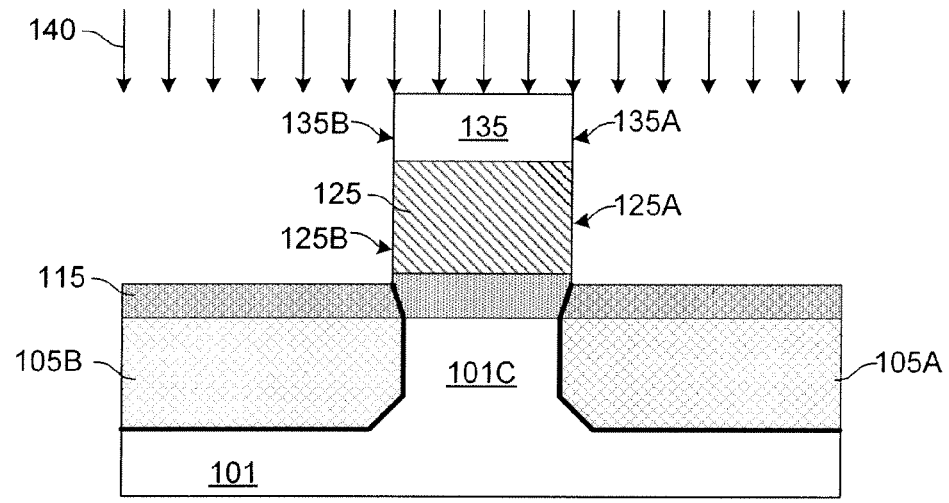

Referring to FIG. 6(D), in accordance with another aspect of the present invention, gate mask 135 is retained on gate structure 125 during a subsequent deep implant process in which an n-type dopant 140 is implanted using known techniques to form n-type deep implant regions 105A and 105B in substrate 101 that are self-aligned to side edges 125A and 125B of gate structure 125, respectively. In one embodiment, the "deep" or "high energy" implants described herein are generated using implant energy levels in the range of 200 keV and 500 keV for polysilicon gates having thicknesses in the range of 100 and 300 nm. In contrast, shallow implants described herein (i.e., where polysilicon is used as the implant mask) are generated using implant energy levels of approximately 60 keV (for Phosphorous) for polysilicon gates having these thicknesses. Note that the actual "deep" or "high energy" implant level is more practically determined by the fabrication process used to form the polysilicon gate, wherein an implant that would pass through a given polysilicon gate and into the underlying monocrystalline substrate is understood to be a "high energy" implant process. Note also that the relatively great thickness of gate mask 135 facilitates a much higher energy implant process than conventional masks, while serving to protect polysilicon gate structure 125. In accordance with another aspect of the present invention, because implant regions 105A and 105B are formed during the same high-energy implant process, both implant regions 105A and 105B have substantially identical dopant levels, and are separated by a p-type channel region 101C that is located below gate structure 125.

Figure 1:
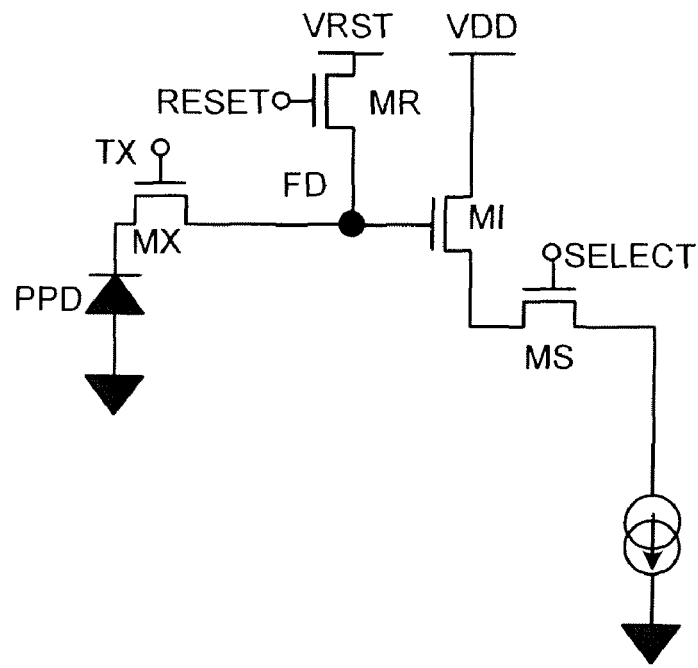
FIG. 1 is simplified schematic diagram showing an exemplary 4T CMOS image sensor pixel including a PPD and a transfer gate.
Figure 2A:
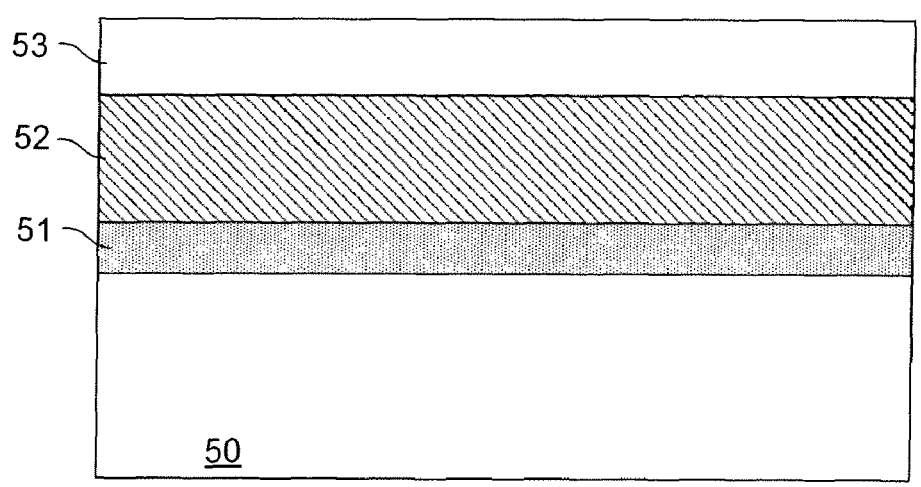
FIGS. 2(A), 2(B), 2(C) and 2(D) are cross-sectional side views showing a conventional process for fabricating the CMOS image sensor pixel of FIG. 1.
Figure 2B:
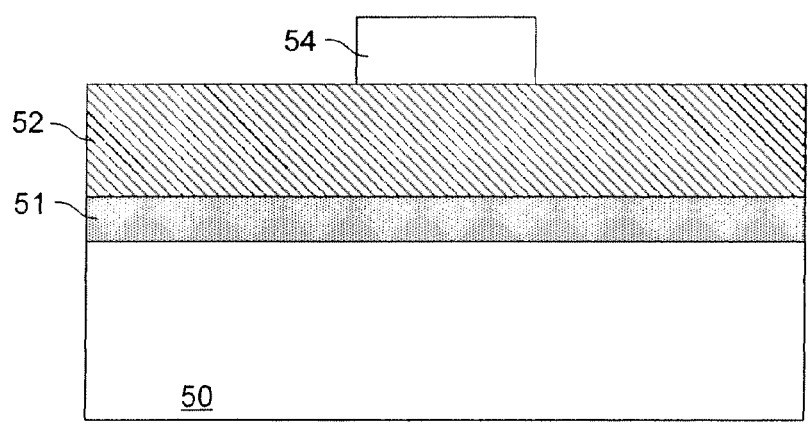
Figure 2C:
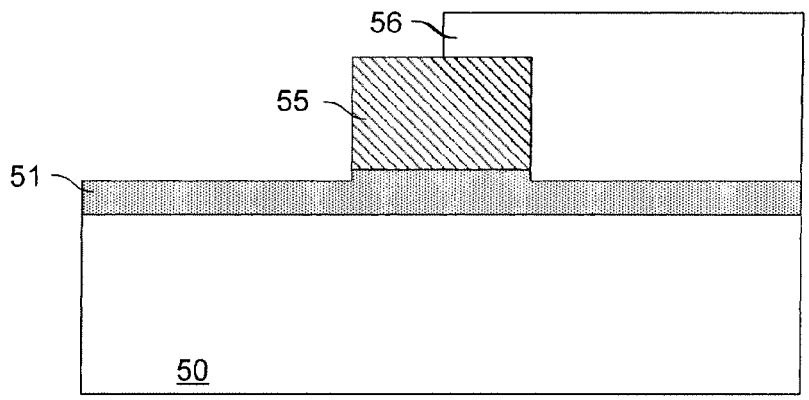
Figure 2D:
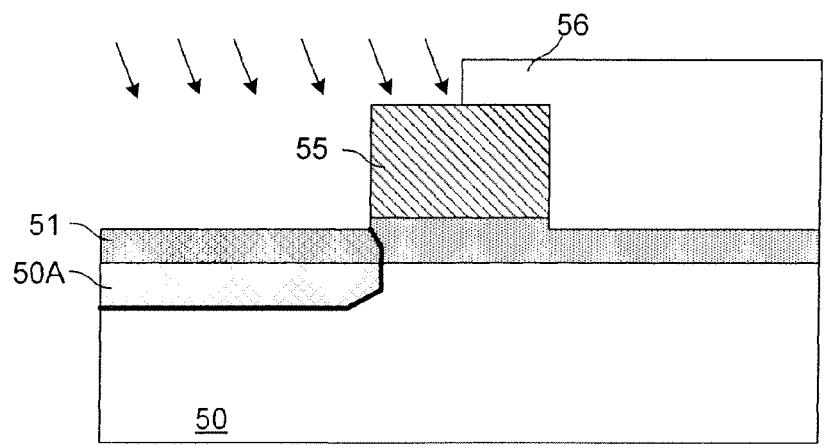
Figure 3A:
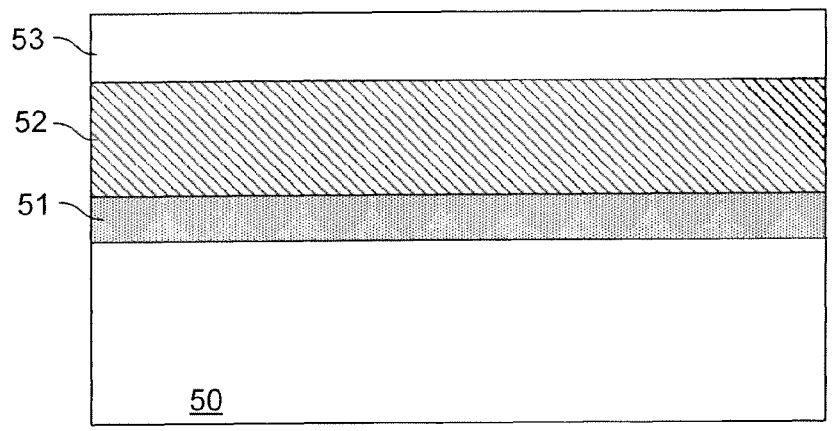
FIGS. 3(A), 3(B), 3(C) and 3(D) are cross-sectional side views showing another conventional process for fabricating the CMOS image sensor pixel of FIG. 1.
Figure 3B:
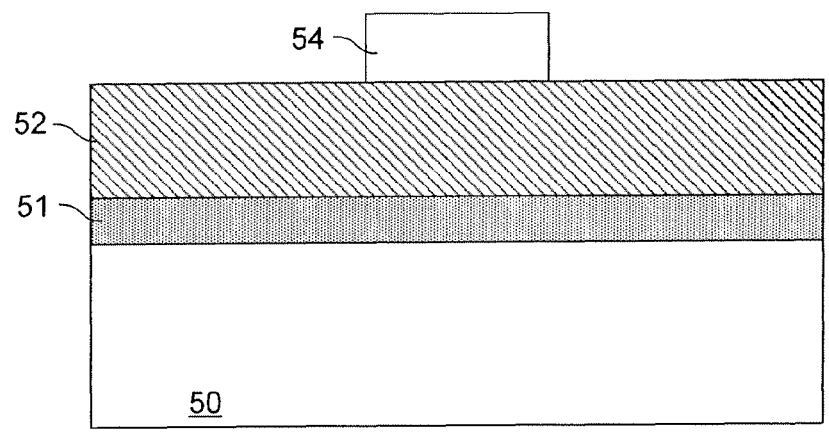
Figure 3C:
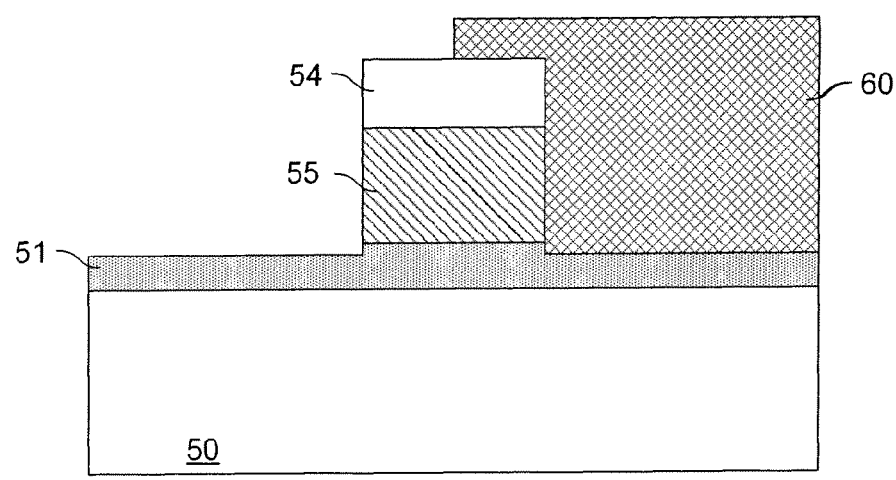
Figure 3D:
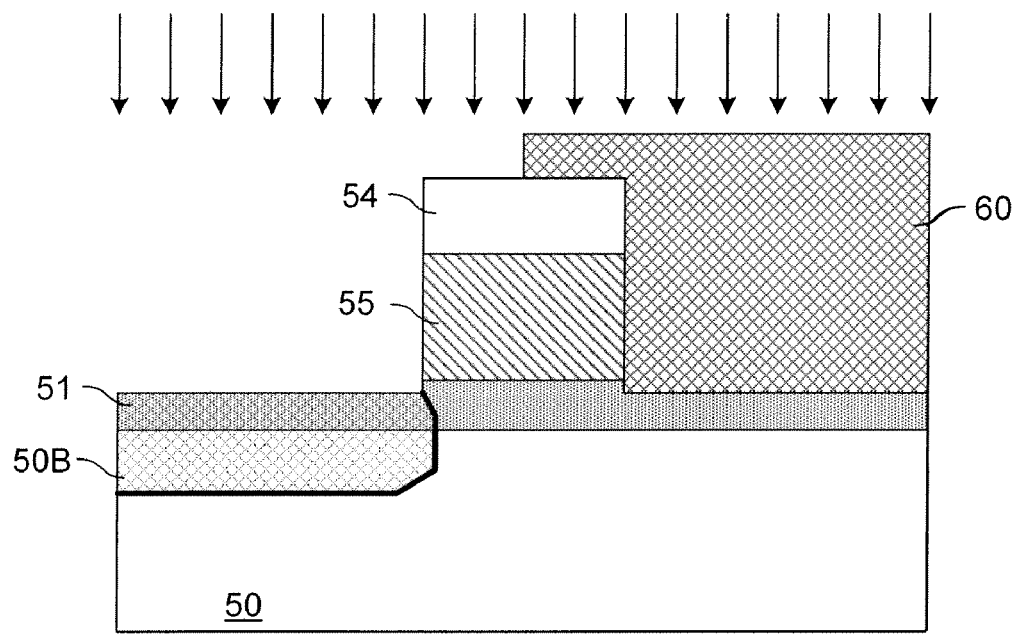
Figure 4A:
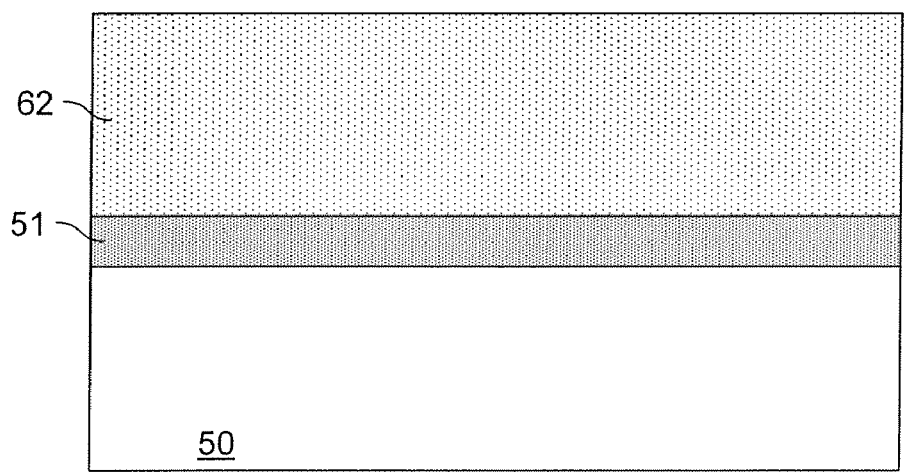
FIGS. 4(A), 4(B), 4(C) and 4(D) are cross-sectional side views showing yet another conventional process for fabricating the CMOS image sensor pixel of FIG. 1.
Figure 4B:
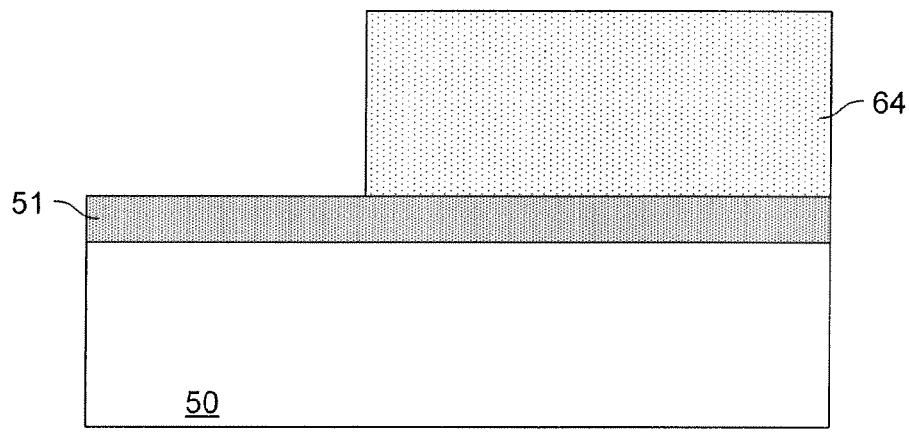
Figure 4C:
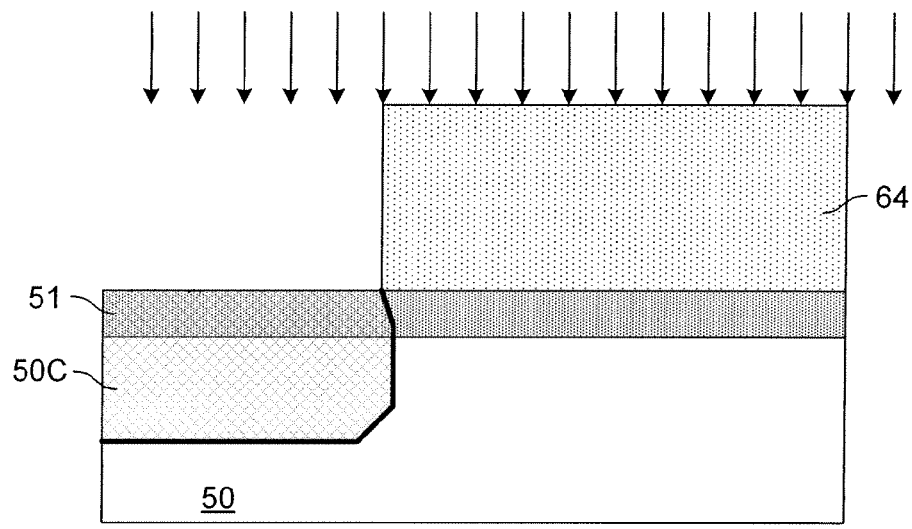
Figure 4D:
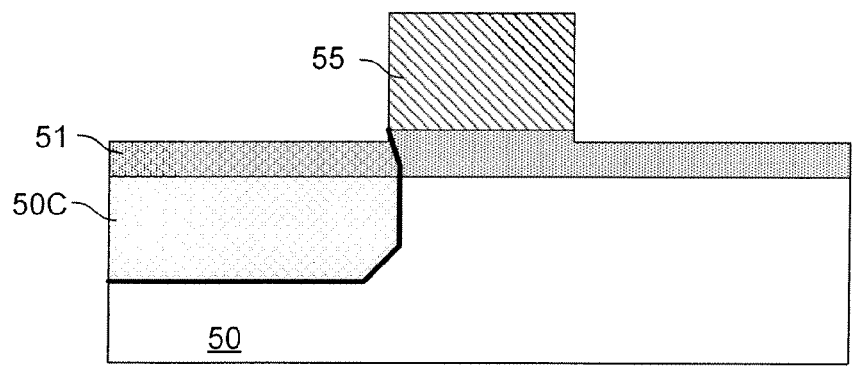
Figure 5A:
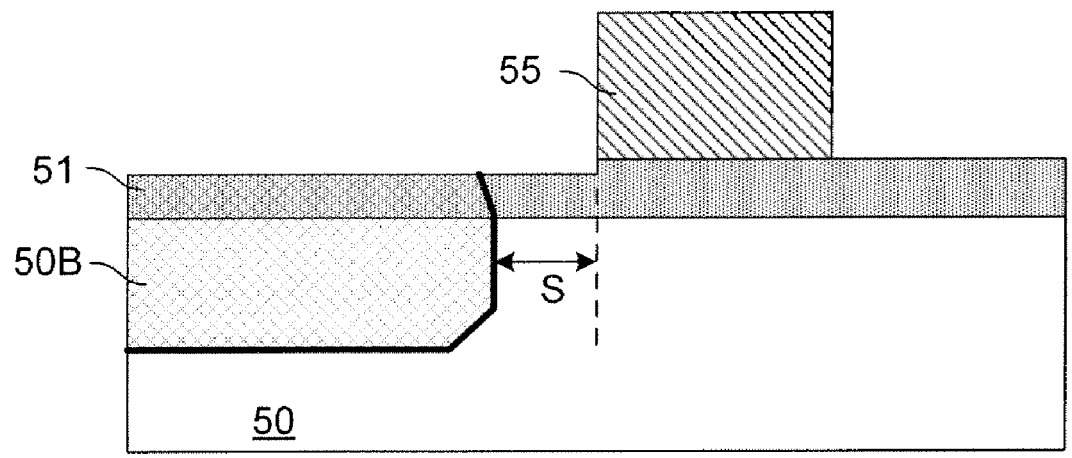
FIGS. 5(A) and 5(B) are cross-sectional side views showing exemplary structures produced by the method depicted in FIGS. 4(A) to 4(D)
Figure 5B:
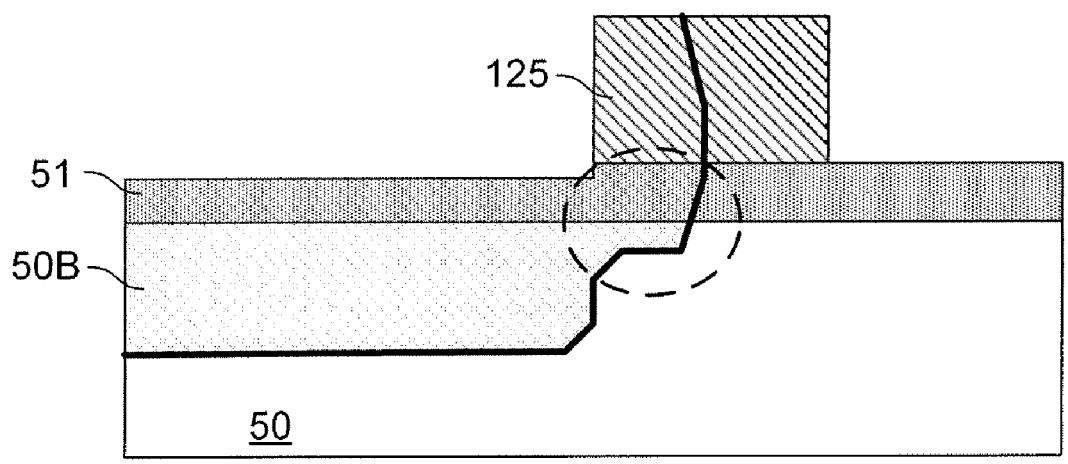
Figure 6E:
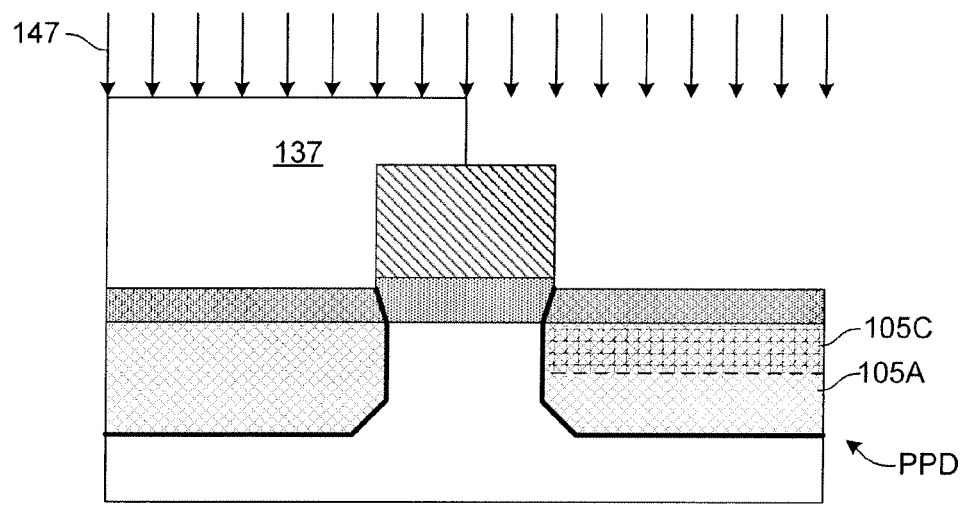
Figure 6F:
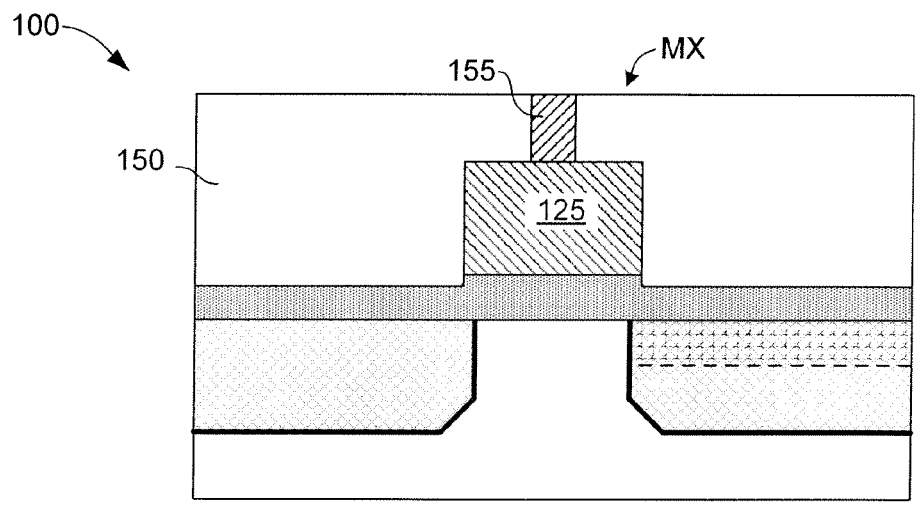

FIG. 6(E) shows a CMOS image sensor 100 during the formation of a shallow P+ implant, and FIG. 6(F) shows a portion of a relatively complete CMOS image sensor 100. Referring to FIG. 6(E), after the high energy implant process described in FIG. 6(D), a relatively shallow P+ implant region 105C is formed over deep implant region 105B (i.e., between deep implant region 105B and the upper surface of substrate 101) using a mask 137 and a suitable dopant 145 according to known techniques to complete the formation of a fully pinned photodiode PPD. Referring to FIG. 6(F), a dielectric layer 150 and metal interconnect structure 155 are formed over gate structure 125 to facilitate operation of a transfer gate MX. The operation of CMOS image sensor 100 is essentially the same as that described above with reference to FIG. 1.

2$^{nd}$ Embodiment

FIGS. 7(A) to 7(E) illustrate portions of a method for forming a CMOS image sensor having a fully pinned photodiode and an associated transfer gate according to an alternative embodiment of the present invention.

Figure 7A:
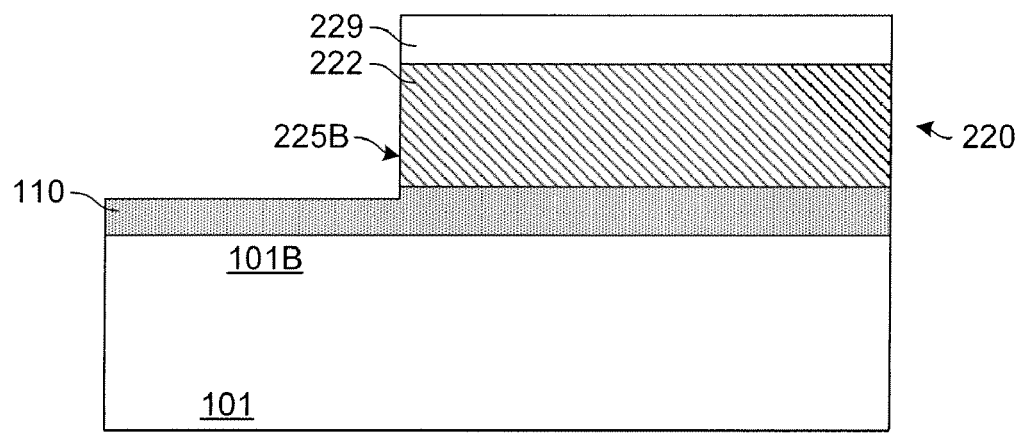
FIGS. 7(A), 7(B), 7(C), 7(D) and 7(E) are cross-sectional side views depicting a process for fabricating CMOS image sensor pixels having PPDs and associated transfer gates according to another embodiment of the present invention.
Figure 7B:
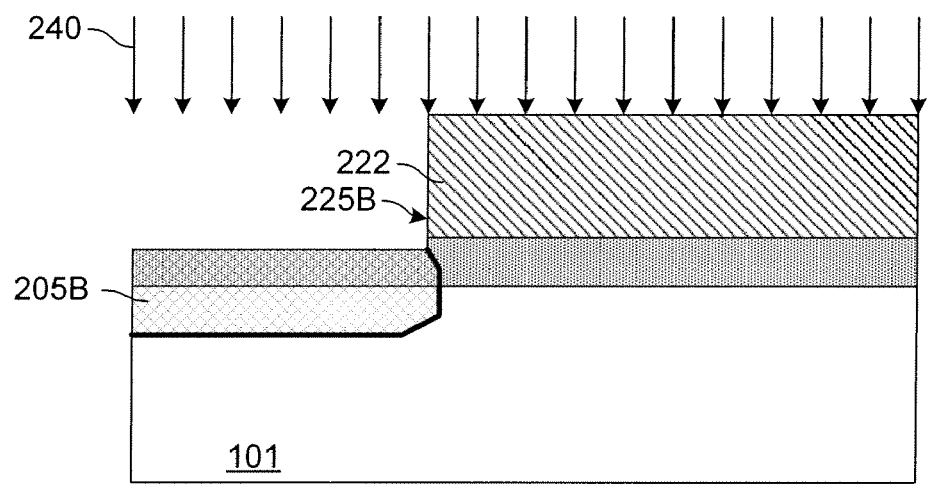

Referring to FIG. 7(A), a dielectric layer 110 and polysilicon layer 220 are formed on substrate 101 in the manner described above with reference to the first embodiment. Next, a relatively thin first mask 229 is patterned on polysilicon layer 220 using known photolithographic techniques, and polysilicon layer 220 is subjected to a first etching process to produce a partially formed polysilicon gate structure 222 that has only one side edge 225B, and a drain side region 101B of substrate 101 is exposed. As indicated in FIG. 7(B), a shallow (drain side) diffusion (implant) region 205B is then formed in the exposed drain side region using an n-type dopant 240 and a relatively low energy implant process. Partially formed polysilicon gate structure 222 is used as a mask during the low energy implant process such that shallow diffusion region 205B is self-aligned to side edge 225B.

Figure 7C:
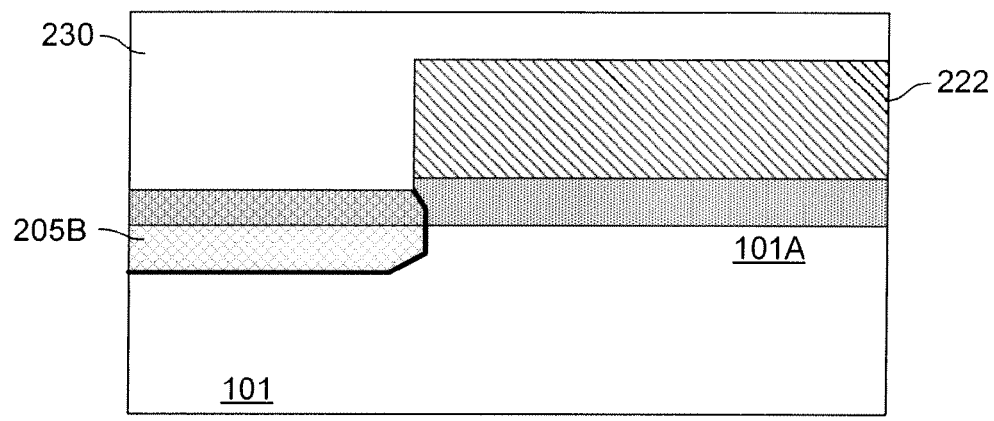
Figure 7D:
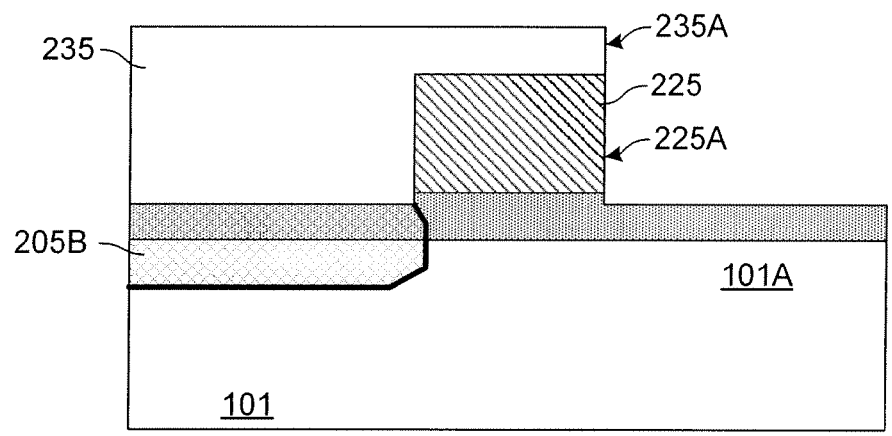
Figure 7E:
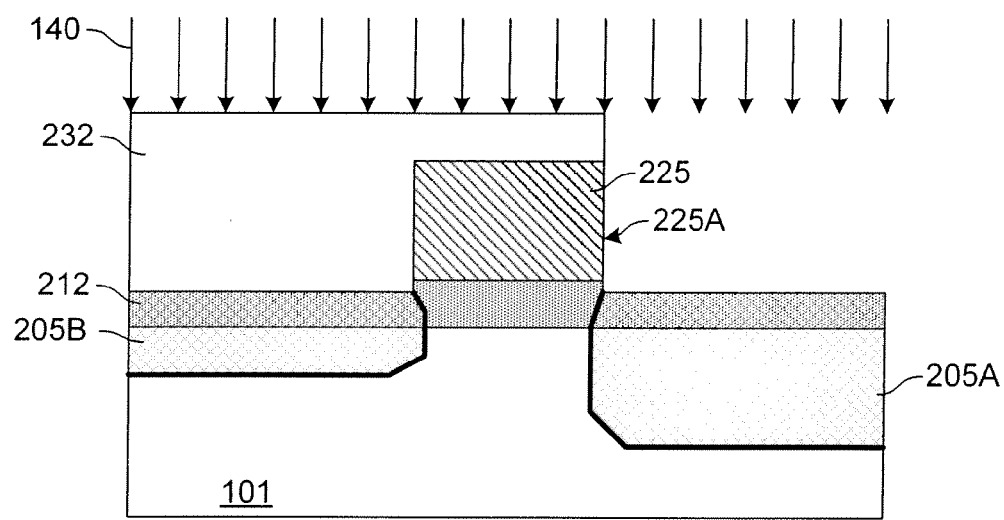

Next, as shown in FIG. 7(C), partially formed polysilicon gate structure 222 and drain side implant region 205B are covered with a relatively thick photoresist layer 230, which is then exposed (patterned) over a photodiode (second side) region 101A of transfer gate structure 222. A second etching process is then used to remove the polysilicon material over the photodiode region, whereby the transfer gate structure 225 is formed with side edge 235A of gate mask 235 self-aligned to side edge 225A of gate structure 225, and photodiode region 101A exposed as indicated in FIG. 7(D). As shown in FIG. 7(E), dopant 140 is implanted as described above to form deep implant region 205A that is self-aligned to side edge 225A of gate structure 225. As described above, a p+ implant (not shown) is then formed over n-type deep implant region 205A to complete the fully pinned photodiode structure.

In the embodiment described above, first mask 229, which is used to create partially formed polysilicon gate structure 222 (see FIG. 7(A)) is thin enough to support fine polysilicon structure, for example, in geometries of 0.25 um and below, but inappropriate for the deep diode implant processes. The second, relatively thick resist mask 230 shown in FIG. 7(C) is then deposited and patterned to form side edge 225A of transfer gate structure 225. The retained, self-aligned photoresist material of gate mask 235 then protects transfer gate structure 225 during the subsequent, relatively high energy implant process depicted in FIG. 7(E).

3rd Embodiment

FIGS. 8(A) to 8(F) illustrate portions of a method for forming a CMOS image sensor having a fully pinned photodiode and an associated transfer gate according to another alternative embodiment of the present invention. Similar to the embodiment described with reference to FIGS. 7(A) to 7(E), the present embodiment includes a two-step polysilicon etch process. However, in contrast to the previous embodiment, the present embodiment facilitates formation of the deep implant region prior to forming the drain side implant.

Figure 8A:
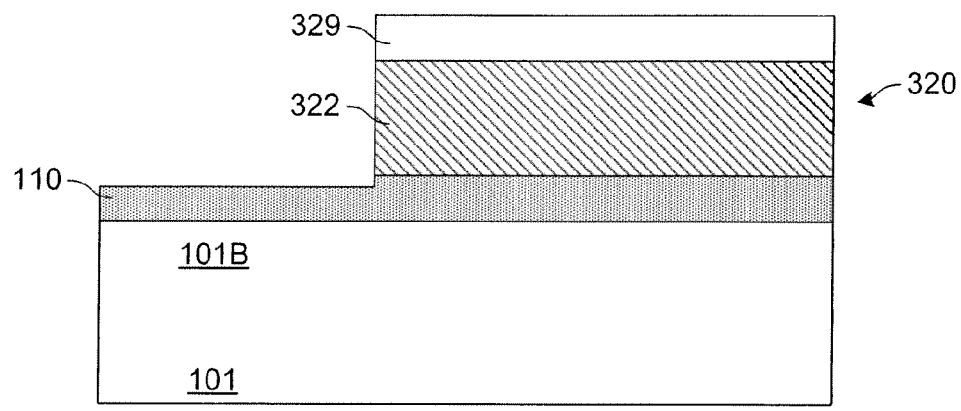
FIGS. 8(A), 8(B), 8(C), 8(D), 8(E) and 8(F) are cross-sectional side views depicting a process for fabricating CMOS image sensor pixels having PPDs and associated transfer gates according to a third embodiment of the present invention.
Figure 8B:
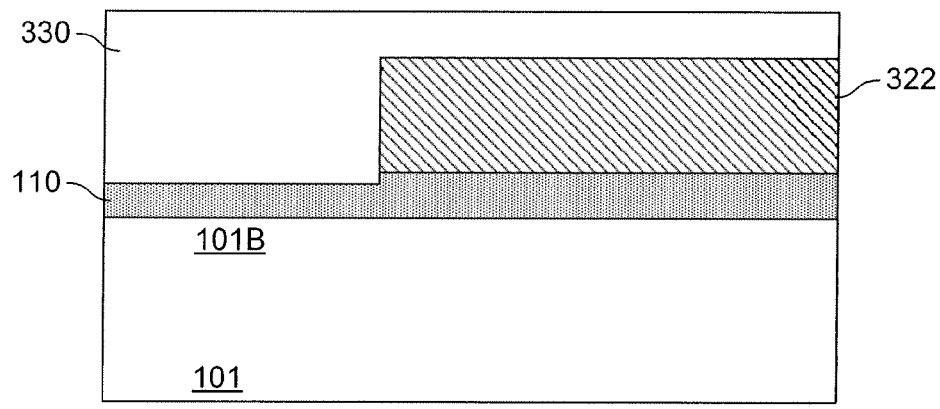
Figure 8C:
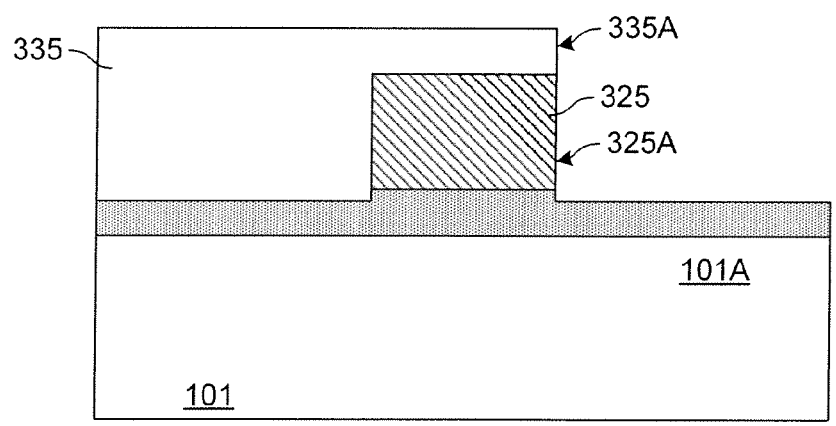
Figure 8D:
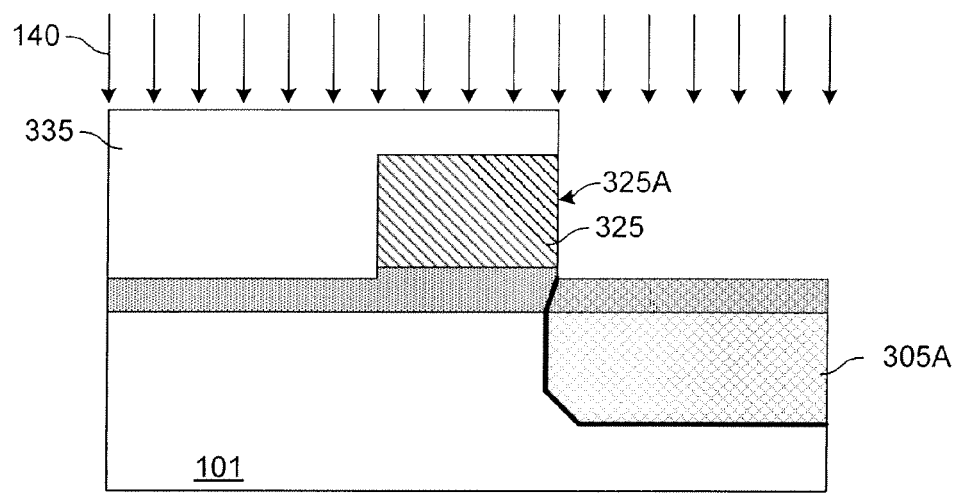
Figure 8E:
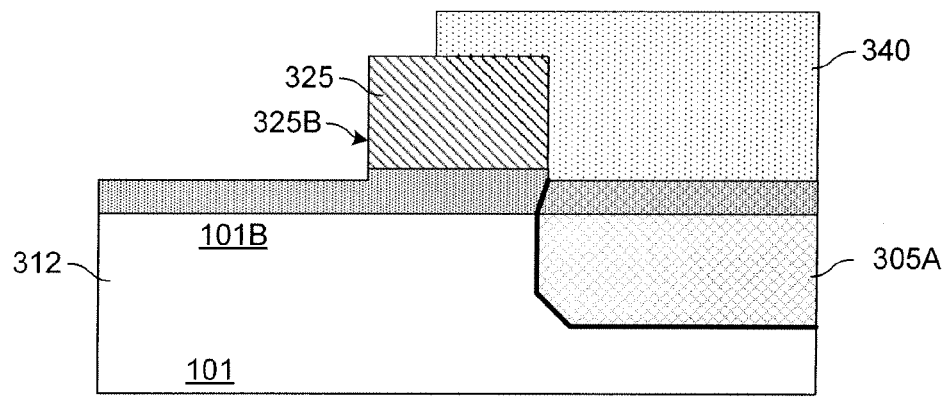
Figure 8F:
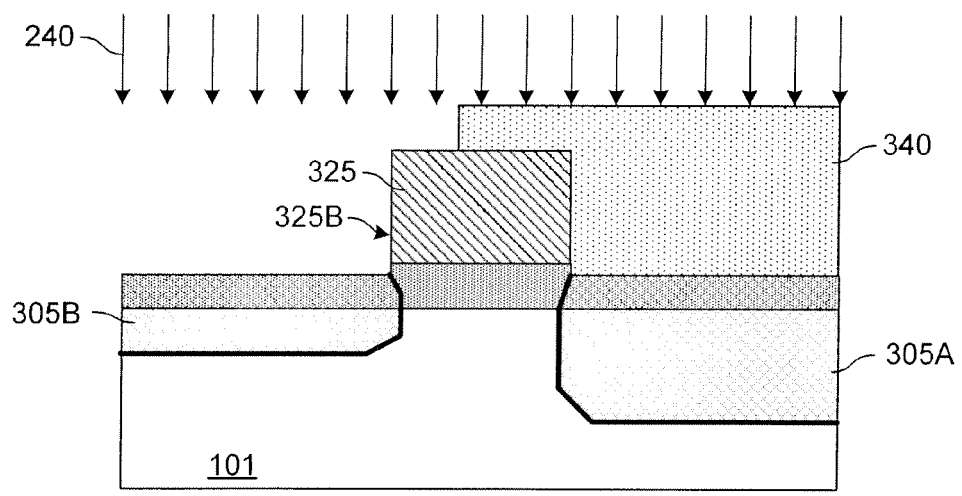

Referring to FIG. 8(A), dielectric layer 110 and polysilicon layer 320 are formed on substrate 101, relatively thin first mask 329 is patterned on polysilicon layer 320, and polysilicon layer 320 is subjected to a first etching process to expose drain side region 101B and to produce a partially formed polysilicon gate structure 322 in the manner described above. As indicated in FIG. 8(B), the first mask is removed, and partially formed polysilicon gate structure 322 and drain side region 101B are covered with a relatively thick photoresist layer 330, which is then patterned and used to perform a second etching process to remove the polysilicon material over photodiode region 101A, thus producing a gate structure 325 such that side edge 325A is aligned with side edge 335A of gate mask 335, as indicated in FIG. 8(C). As shown in FIG. 8(D), dopant 140 is implanted using a relatively high energy implantation process to form deep implant region 305A that is self-aligned to side edge 325A of gate structure 325. The p+ shallow implant (not shown) needed to complete the fully pinned photodiode may then be formed using mask 335, or may be formed using a supplemental masking step. As indicated in FIG. 8(E), a relatively thin third mask 340 is then patterned over deep implant region 305A and gate structure 325 (i.e., such that drain side region 101B is exposed). Finally, a shallow implant region 305B is formed using a dopant 240 that is diffused using a relatively low energy implant process.

Although the present invention has been described with respect to certain specific embodiments, it will be clear to those skilled in the art that the inventive features of the present invention are applicable to other embodiments as well, all of which are intended to fall within the scope of the present invention. For example, although the present invention has been described with reference to CMOS image sensors having pinned photodiodes, the methods described with reference to the above embodiment may be modified to produce other types of ICs that require self-registration (e.g., self-alignment or offset alignment achieved by a diagonal implant process) between a deep implant region and a relatively thin polysilicon structure.

The invention claimed is:

1. A method for fabricating a CMOS image sensor including a pinned photodiode and an associated transfer gate such that the pinned photodiode includes a deep implant region diffused into a substrate and aligned with a first side edge of a polycrystalline silicon (polysilicon) gate structure of the transfer gate, wherein the method comprises: forming a dielectric layer on an upper surface of the substrate; forming a polysilicon layer on the dielectric layer; etching a portion of the polysilicon layer to expose a drain side region of the substrate, and to form a partially formed gate structure having a second side edge; implanting a second dopant into the exposed drain side region of the substrate adjacent to the second side edge of the partially formed gate structure such that a shallow implant region is formed that is self-aligned to the second side edge of the partially formed gate structure; forming a mask material layer over the shallow implant region and the partially formed gate structure; patterning mask material layer to form a gate mask such that a portion of the partially formed gate structure is exposed adjacent to a side edge of said gate mask; etching said exposed portion of the partially formed gate structure to form said gate structure having said first side edge self-aligned to the side edge of said gate mask; and forming said deep implant region by implanting a dopant into the substrate adjacent to the first side edge using a relatively high energy implant process such that the deep implant region is self-aligned to the first side edge of the gate structure, wherein the gate mask is retained on the gate structure during forming of said deep implant region.

2. A method for fabricating a CMOS image sensor including a pinned photodiode and an associated transfer gate such that the pinned photodiode includes a deep implant region diffused into a substrate and aligned with a first side edge of a polycrystalline silicon (polysilicon) gate structure of the transfer gate, wherein the method comprises: forming a dielectric layer on an upper surface of the substrate; forming a polysilicon layer on the dielectric layer; etching a portion of the polysilicon layer to expose a drain side region of the substrate, and to form a partially formed gate structure having a second side edge; forming a mask material layer over the drain side region and the partially formed gate structure; patterning said mask material layer to form a gate mask such that a portion of the partially formed gate structure is exposed adjacent to a side edge of said gate mask; etching said exposed portion of the partially formed gate structure to form said gate structure having said first side edge self-aligned to the side edge of said gate mask; and forming said deep implant region by implanting a dopant into the substrate adjacent to the first side edge using a relatively high energy implant process such that the deep implant region is self-aligned to the first side edge of the gate structure, wherein the gate mask is retained on the gate structure during forming of said deep implant region.

3. The method of claim 2, further comprising, after forming said deep implant region, forming a shallow implant region in the drain side region of the substrate using a relatively low energy implant process.

* * * * *